(12) United States Patent
Onaka et al.

(10) Patent No.: US 11,495,884 B2
(45) Date of Patent: Nov. 8, 2022

(54) ANTENNA DEVICE AND COMMUNICATION DEVICE

(71) Applicant: Murata Manufacturing Co., Ltd., Kyoto (JP)

(72) Inventors: Kengo Onaka, Kyoto (JP); Yoshiki Yamada, Kyoto (JP); Hirotsugu Mori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 267 days.

(21) Appl. No.: 16/856,502

(22) Filed: Apr. 23, 2020

(65) Prior Publication Data

US 2020/0251826 A1     Aug. 6, 2020

Related U.S. Application Data

(63) Continuation of application No. PCT/JP2018/030689, filed on Aug. 20, 2018.

(30) Foreign Application Priority Data

Oct. 30, 2017   (JP) .............................. JP2017-208982

(51) Int. Cl.
*H01Q 5/335* (2015.01)
*H01Q 23/00* (2006.01)
(Continued)

(52) U.S. Cl.
CPC .......... *H01Q 5/335* (2015.01); *H01Q 9/0435* (2013.01); *H01Q 21/065* (2013.01); *H01Q 23/00* (2013.01)

(58) Field of Classification Search
CPC ...... H01Q 1/2283; H01Q 5/335; H01Q 5/342; H01Q 5/357; H01Q 5/30; H01Q 5/307;
(Continued)

(56) References Cited

U.S. PATENT DOCUMENTS 7,132,984 B2 *  11/2006  Kameda ............... H01Q 9/0407
                                                          343/700 MS
10,079,587 B2     9/2018  Ishizuka et al.
(Continued)

FOREIGN PATENT DOCUMENTS

CN          1666380 A        9/2005
CN        105281026 A        1/2016
(Continued)

OTHER PUBLICATIONS

Office Action for CN Patent Application No. 201880070835.0 dated Nov. 25, 2020.
(Continued)

*Primary Examiner* — Robert Karacsony
(74) *Attorney, Agent, or Firm* — Pearne & Gordon LLP

(57) ABSTRACT

An antenna device includes a dielectric substrate, an emitting electrode, a power feed circuit that feeds power to the emitting electrode, and a filter circuit formed on a path connecting the emitting electrode to the power feed circuit, the filter circuit is constituted by two or more circuits that are cascade connected, each of the two or more circuits is either a HPF or a LPF, and the antenna device does not have a resonant frequency of the emitting electrode and has two or more resonant frequencies different from the resonant frequency of the emitting electrode, each of which is formed by the emitting electrode and a corresponding one of the two or more circuits.

12 Claims, 11 Drawing Sheets

(51) Int. Cl.
*H01Q 21/06* (2006.01)
*H01Q 9/04* (2006.01)

(58) Field of Classification Search
CPC ........ H01Q 5/314; H01Q 5/50; H01Q 9/0435; H01Q 9/0442; H01Q 9/045; H01Q 9/0407; H01Q 21/065; H01Q 23/00
See application file for complete search history.

(56) References Cited

U.S. PATENT DOCUMENTS

| | | |
|---|---|---|
| 10,141,650 B2 | 11/2018 | Tenno |
| 10,498,025 B2 | 12/2019 | Mizunuma et al. |
| 2006/0055601 A1 | 3/2006 | Kameda et al. |
| 2019/0221937 A1* | 7/2019 | Onaka .................... H01Q 5/392 |

FOREIGN PATENT DOCUMENTS

| | | |
|---|---|---|
| JP | H06-224630 A | 8/1994 |
| JP | H10-303640 A | 11/1998 |
| JP | 2001-326319 A | 11/2001 |
| JP | 2002-271216 A | 9/2002 |
| JP | 2004-040597 A | 2/2004 |
| WO | 2016-063759 A1 | 4/2016 |
| WO | 2016-0988527 A1 | 6/2016 |
| WO | 2016-152603 A1 | 9/2016 |

OTHER PUBLICATIONS

International Search Report issued in Patent Application No. PCT/JP2018/030689 dated Nov. 6, 2018.
Written Opinion issued in Patent Application No. PCT/JP2018/030689 dated Nov. 6, 2018.

* cited by examiner

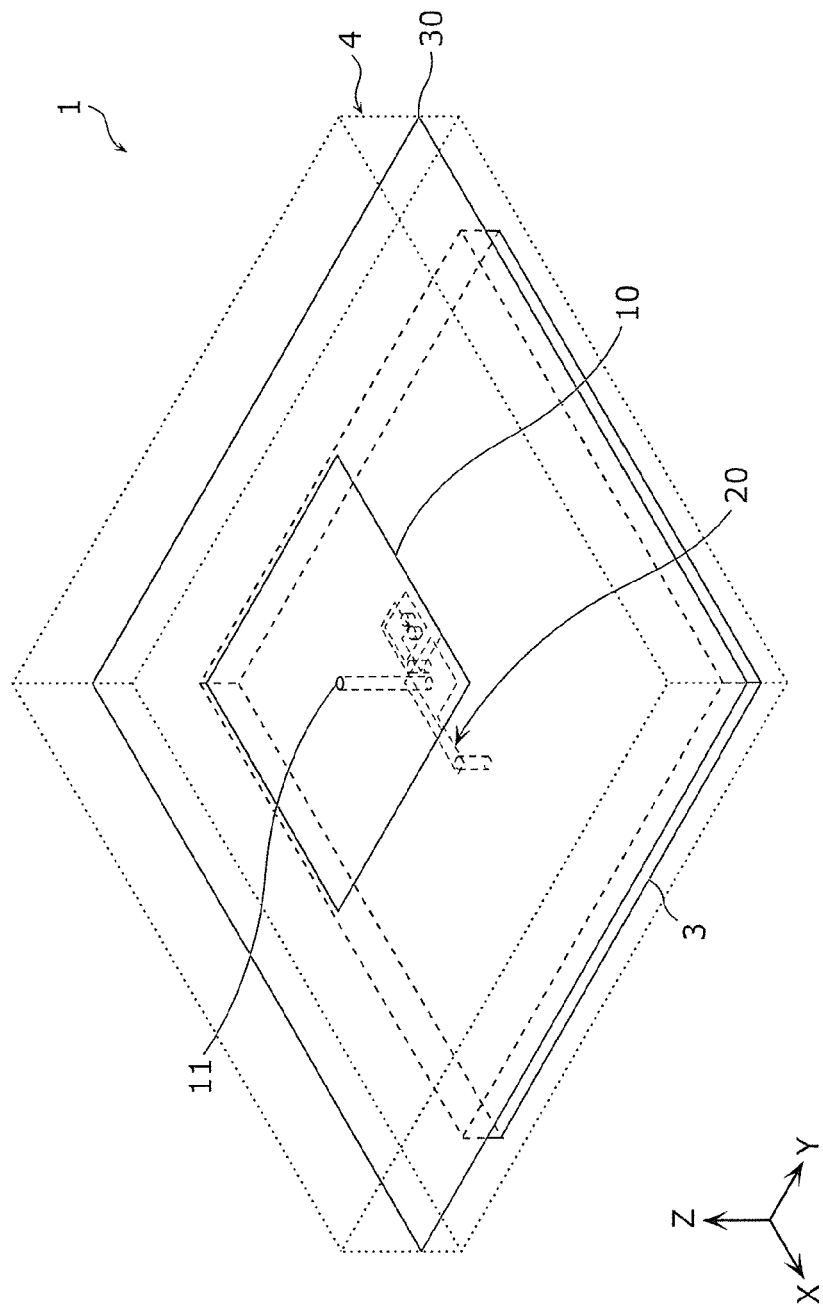

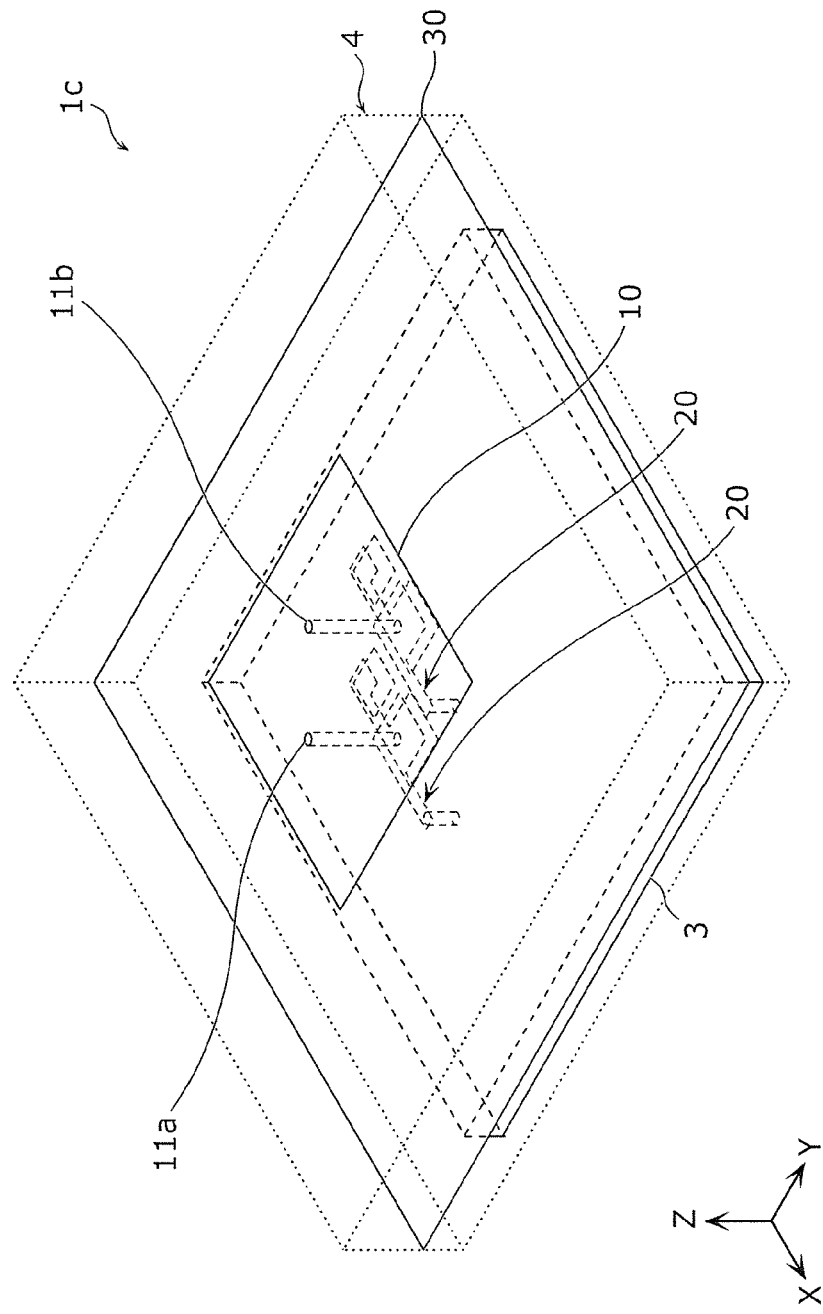

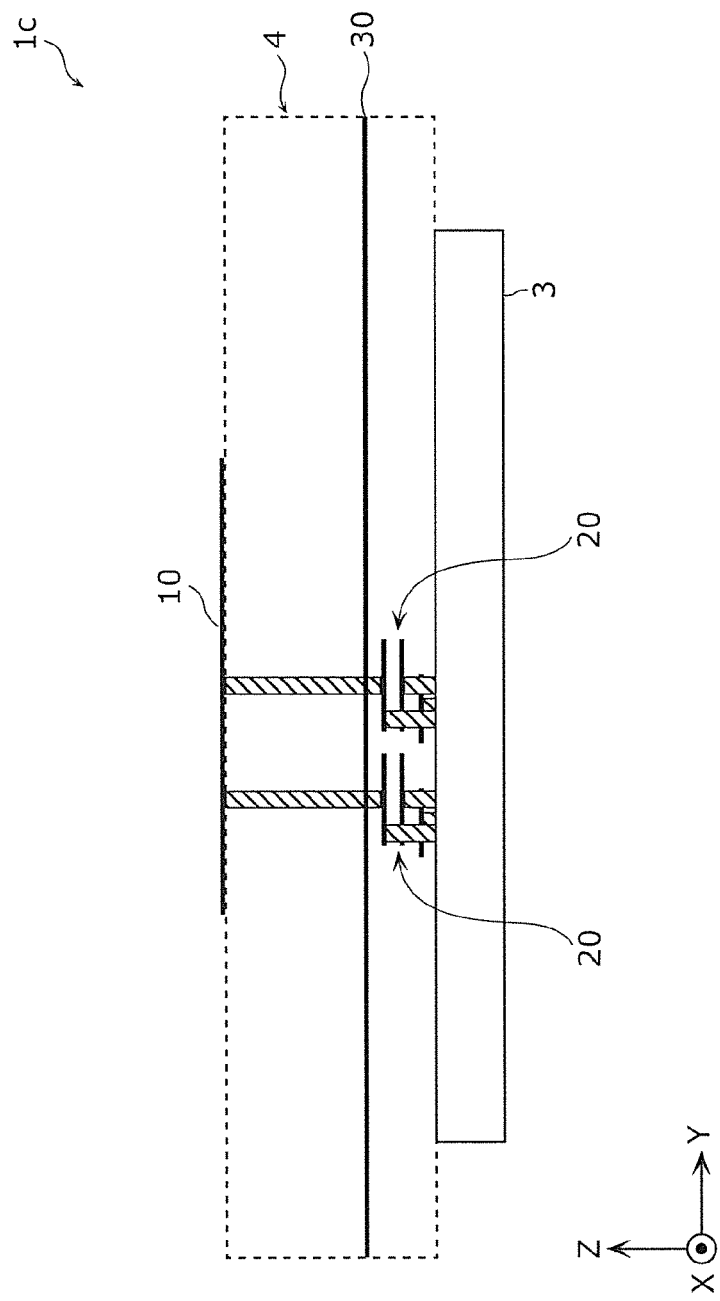

ANTENNA DEVICE AND COMMUNICATION DEVICE

This is a continuation of International Application No. PCT/JP2018/030689 filed on Aug. 20, 2018 which claims priority from Japanese Patent Application No. 2017-208982 filed on Oct. 30, 2017. The contents of these applications are incorporated herein by reference in their entireties.

BACKGROUND

Technical Field

The present disclosure relates to an antenna device and a communication device.

Hitherto, as a general patch antenna module, a module has been disclosed in which a patch antenna is implemented on one main surface of a dielectric substrate and a power feed circuit (for example, a radio frequency integrated circuit (RFIC)) is implemented on the other main surface (for example, Patent Document 1).

Patent Document 1: International Publication No. 2016/063759

BRIEF SUMMARY

Recently, an antenna device (antenna module) that achieves dual-band support has been desired. For example, in the patch antenna disclosed in Patent Document 1 described above, one antenna has only one resonant frequency and covers a narrow band. Thus, dual-band support can be achieved by using a fundamental of the patch antenna as the lower frequency band and a harmonic of the patch antenna as the higher frequency band. However, in this case, the directivity of the fundamental and that of the harmonic do not match, and thus the antenna efficiency decreases.

Thus, the present disclosure provides an antenna device and the like that can achieve dual-band support while suppressing a reduction in antenna efficiency.

An antenna device according to an aspect of the present disclosure includes a dielectric substrate, an emitting electrode formed in or on the dielectric substrate, a power feed circuit that is formed in or on the dielectric substrate and that feeds power to the emitting electrode, and a filter circuit formed on a path connecting the emitting electrode to the power feed circuit, the filter circuit is constituted by two or more circuits that are cascade connected, each of the two or more circuits is either a high-pass filter circuit or a low-pass filter circuit, the high-pass filter circuit having at least one of a capacitive element serially connected on the path and an inductor connected between a node on the path and ground, the low-pass filter circuit having at least one of an inductor serially connected on the path and a capacitor connected between a node on the path and ground, and the antenna device does not have a resonant frequency of the emitting electrode and has two or more resonant frequencies different from the resonant frequency of the emitting electrode, each of which is formed by the emitting electrode and a corresponding one of the two or more circuits.

According to this, matching is achieved at the two or more resonant frequencies different from the resonant frequency of the emitting electrode. In this case, a fundamental is used at each of the two or more resonant frequencies, and thus the directivities match. Thus, while suppressing a reduction in antenna efficiency, dual-band support can be achieved.

In addition, the two or more circuits may include both the high-pass filter circuit and the low-pass filter circuit, and the two or more resonant frequencies may include a resonant frequency formed by the emitting electrode and the high-pass filter circuit and lower than the resonant frequency of the emitting electrode and a resonant frequency formed by the emitting electrode and the low-pass filter circuit and higher than the resonant frequency of the emitting electrode.

According to this, matching can be achieved by the high-pass filter circuit on the low frequency side of the resonant frequency of the emitting electrode and matching can be achieved by the low-pass filter circuit on the high frequency side of the resonant frequency of the emitting electrode. Thus, dual-band support can be achieved by using the resonant frequency lower than the resonant frequency of the emitting electrode and the resonant frequency higher than the resonant frequency of the emitting electrode.

In addition, the high-pass filter circuit may form a first pass band on a high frequency side of the resonant frequency of the emitting electrode, the low-pass filter circuit may form a second pass band on a low frequency side of the resonant frequency of the emitting electrode, and the filter circuit may form a pass band between the first pass band and the second pass band.

For example, there are a problem in that for example harmonics of radio frequency signals used by the antenna device are output from the emitting electrode and a problem in that disturbing waves received by the emitting electrode are input to a low noise amplifier (LNA) and the LNA saturates. To deal with these, in this aspect, the high-pass filter forms the first pass band, the low-pass filter forms the second pass band, and the filter circuit forms the pass band between the first pass band and the second pass band. These filters allow signals of the first pass band, the second pass band, and the pass band between the first and second pass bands (that is, radio frequency signals used by the antenna device) to pass therethrough, and attenuate signals outside the pass bands. Consequently, as the signals outside the pass bands, unwanted waves such as harmonics and disturbing waves can be attenuated.

In addition, the two or more circuits may include both the high-pass filter circuit and the low-pass filter circuit, and the high-pass filter circuit may be connected closer to the emitting electrode than the low-pass filter circuit is.

In a case where the high-pass filter circuit is connected closer to the emitting electrode than the low-pass filter circuit is and a case where the low-pass filter circuit is connected closer to the emitting electrode than the high-pass filter circuit is, when equivalent characteristics are desired in each case, the inductance of the inductor included in the high-pass filter circuit can be made smaller in the former case. In general, the smaller the inductance of an inductor, the smaller the component size and the higher the Q value. Thus, in a case where the high-pass filter circuit is connected closer to the emitting electrode than the low-pass filter circuit is, the antenna device can be decreased in size and the Q value of the inductor can be increased.

In addition, the two or more circuits may include both the high-pass filter circuit and the low-pass filter circuit, and the low-pass filter circuit may be connected closer to the emitting electrode than the high-pass filter circuit is.

In general, the effect caused by phase rotation and by a change in impedance becomes stronger as the frequency increases. The low-pass filter circuit is a circuit that forms a resonant frequency higher than the resonant frequency of the emitting electrode, and thus is more likely to be affected by the effect than the high-pass filter circuit. Thus, in a case where the high-pass filter circuit is connected closer to the emitting electrode than the low-pass filter circuit is, the low-pass filter circuit is greatly affected by the effect caused by phase rotation and by a change in impedance due to the high-pass filter circuit and it becomes difficult to achieve impedance matching. Thus, in a case where the low-pass filter circuit is connected closer to the emitting electrode than the high-pass filter circuit is, impedance matching is easily achieved.

In addition, the high-pass filter circuit may have the capacitive element serially connected on the path and the inductor connected between the node on the path and ground, and the low-pass filter circuit may have, among the inductor serially connected on the path and the capacitor connected between the node on the path and ground, the capacitor. In addition, the high-pass filter circuit may have the capacitive element serially connected on the path and the inductor connected between the node on the path and ground, and the low-pass filter circuit may have the inductor serially connected on the path and the capacitor connected between the node on the path and ground.

According to this, the circuit configuration of the low-pass filter circuit is not particularly limited. For example, the configuration does not have to include both the inductor and the capacitor or may include only the capacitor but no inductor.

In addition, the emitting electrode may have a first feeding point and a second feeding point, which are provided at different positions in or on the emitting electrode, and a direction of a polarized wave formed by the first feeding point and a direction of a polarized wave formed by the second feeding point may differ from each other.

According to this, one emitting electrode can handle two polarized waves whose directions differ from each other, and even in a case where a plurality of polarized waves are used, the emitting electrode does not have to be provided for each polarized wave, and thus the antenna device can be decreased in size.

In addition, a plurality of emitting electrodes including the emitting electrode may be provided, and the plurality of emitting electrodes may be arranged in a matrix in or on the dielectric substrate.

According to this, the antenna device can be applied to a massive multiple-input and multiple-output (MIMO) system.

In addition, the filter circuit may be formed in the dielectric substrate.

According to this, the antenna device can be decreased in size by an amount equivalent to the space that would have been taken by the filter circuit, which is formed in the dielectric substrate.

In addition, an antenna device according to an aspect of the present disclosure includes a dielectric substrate, an emitting electrode formed in or on the dielectric substrate, a power feed circuit that is formed in or on the dielectric substrate and that feeds power to the emitting electrode, and a filter circuit formed on a path connecting the emitting electrode to the power feed circuit, the filter circuit is constituted by two or more circuits that are cascade connected, and each of the two or more circuits is either a high-pass filter circuit or a low-pass filter circuit, the high-pass filter circuit having at least one of a capacitive element serially connected on the path and an inductor connected between a node on the path and ground, the low-pass filter circuit having at least one of an inductor serially connected on the path and a capacitor connected between a node on the path and ground.

According to this, instead of failing to achieve matching at the resonant frequency of the emitting electrode, matching is achieved at two or more resonant frequencies different from the resonant frequency of the emitting electrode. In this case, a fundamental is used at each of the two or more resonant frequencies, and thus the directivities match. Thus, while suppressing a reduction in antenna efficiency, dual-band support can be achieved.

In addition, the two or more circuits may include both the high-pass filter circuit and the low-pass filter circuit, and the high-pass filter circuit may be connected closer to the emitting electrode than the low-pass filter circuit is.

In a case where the high-pass filter circuit is connected closer to the emitting electrode than the low-pass filter circuit is and a case where the low-pass filter circuit is connected closer to the emitting electrode than the high-pass filter circuit is, when equivalent characteristics are desired in each case, the inductance of the inductor included in the high-pass filter circuit can be made smaller in the former case. In general, the smaller the inductance of an inductor, the smaller the component size and the higher the Q value. Thus, in a case where the high-pass filter circuit is connected closer to the emitting electrode than the low-pass filter circuit is, the antenna device can be decreased in size and the Q value of the inductor can be increased.

In addition, a communication device according to an aspect of the present disclosure includes the antenna device described above and a baseband integrated circuit (BBIC), and the power feed circuit is a radio frequency integrated circuit (RFIC) that performs at least one of transmission-system signal processing for up-converting a signal input from the BBIC and outputting the resulting signal to the emitting electrode and receiving-system signal processing for down-converting a radio frequency signal input from the emitting electrode and outputting the resulting signal to the BBIC.

According to this, a communication device can be provided that can achieve dual-band support while suppressing a reduction in antenna efficiency.

According to an antenna device and the like according to the present disclosure, while suppressing a reduction in antenna efficiency, dual-band support can be achieved.

BRIEF DESCRIPTION OF THE SEVERAL VIEWS OF THE DRAWINGS

FIG. 1A is an external perspective view of an antenna device according to a first embodiment.

FIG. 12A is an external perspective view of an antenna device according to a second embodiment.

FIG. 12B is a side perspective view of the antenna device according to the second embodiment.

DETAILED DESCRIPTION

Figure 1B:
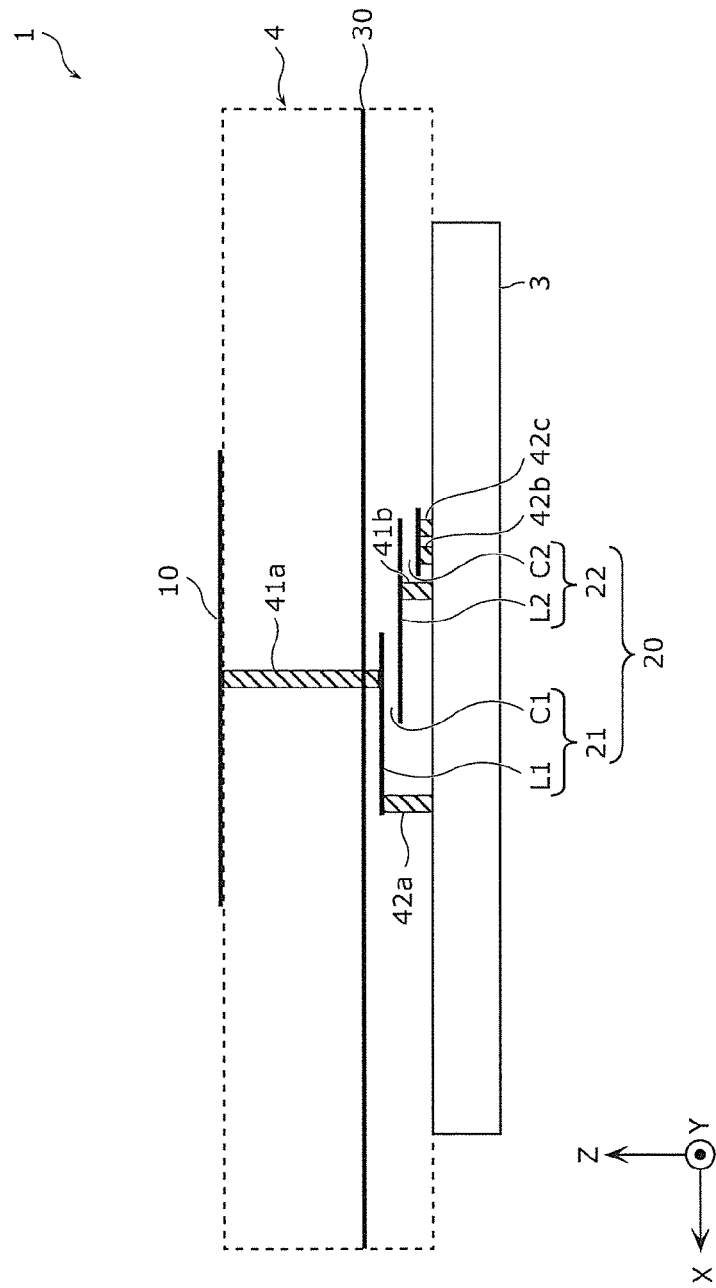
FIG. 1B is a side perspective view of the antenna device according to the first embodiment.

In the following, embodiments of the present disclosure will be described in detail with reference to the drawings. Note that each of the embodiments to be described below indicates a general or specific example. Numerical values, shapes, materials, structural elements, and arrangement and connection forms of the structural elements described in the following embodiments are examples, and it is not intended to limit the present disclosure. Among the structural elements in the following embodiments, structural elements that are not described in independent claims will be described as optional structural elements. In addition, the sizes of and the size ratios between the structural elements are not always precise. In addition, in each of the drawings, configurations that are substantially the same are denoted by the same reference numerals, and the redundant description may be omitted or simplified. In addition, in the following embodiments, "(is/are/be) connected" means not only the case where something is directly connected but also the case where something is electrically connected with, for example, another element interposed therebetween.

First Embodiment

[1. Configuration of Antenna Device (Example 1)]

FIG. 1A is an external perspective view of an antenna device 1 according to a first embodiment. FIG. 1B is a side perspective view of the antenna device 1 according to the first embodiment. FIG. 1B is the side perspective view of the antenna device 1 obtained when the antenna device 1 is seen from the plus side in the Y-axis direction.

Hereinafter, a description will be made by treating the thickness direction of the antenna device 1 as the Z-axis direction, directions perpendicular to the Z-axis direction and orthogonal to each other as the X-axis direction and the Y-axis direction, and the Z-axis plus side as a top-surface side of the antenna device 1. However, in an actual use mode, there may be a case where the thickness direction of the antenna device 1 is not the top-down direction, and thus the top-surface side of the antenna device 1 is not always the up direction. The same applies to antenna devices according to second and third embodiments to be described later.

The antenna device 1 includes a dielectric substrate 4 and an emitting electrode 10, a filter circuit 20, and a power feed circuit (radio frequency integrated circuit (RFIC)) 3, each of which is formed in or on the dielectric substrate 4. The antenna device 1 is, for example, a millimeter-wave (for example, 28 GHz and 39 GHz) dual-band antenna module for the fifth generation mobile communication system (5G).

The dielectric substrate 4 is a multilayer board having first and second main surfaces, which face with each other. The first main surface is a Z-axis plus side main surface of the dielectric substrate 4, and the second main surface is a Z-axis minus side main surface of the dielectric substrate 4. The dielectric substrate 4 has a configuration in which a dielectric material is filled between the first main surface and the second main surface. In FIGS. 1A and 1B, the dielectric material is transparent, which makes the inside of the dielectric substrate 4 visible. As the dielectric substrate 4, for example, a low temperature co-fired ceramics (LTCC) substrate or a printed board is used. In addition, as various conductors formed in or on the dielectric substrate 4, Al, Cu, Au, Ag, or a metal whose major constituent is an alloy of some of these Al, Cu, Au, and Ag is used.

The emitting electrode 10 is a patch antenna constituted by a thin-film pattern conductor provided on the first main surface of the dielectric substrate 4 and parallel to the main surface of the dielectric substrate 4. The emitting electrode 10 has, for example, a rectangular shape as viewed in a plan view of the dielectric substrate 4 but may have, for example, a circular shape or a polygonal shape. In addition, the emitting electrode 10 may be formed on an inner layer of the dielectric substrate 4 so as to prevent, for example, oxidation, or a protective film may be formed on the emitting electrode 10. In addition, the emitting electrode 10 may be constituted by a power feed conductor and a non-power feed conductor arranged above the power feed conductor.

The power feed circuit 3 is formed on the second main surface side of the dielectric substrate 4 and constitutes an RFIC that performs signal processing on a transmission signal to be transmitted by or a reception signal received by the emitting electrode 10. The power feed circuit 3 is connected to the emitting electrode 10 with the filter circuit 20 interposed therebetween. Note that, in the present embodiment, the power feed circuit 3 is provided on the second main surface of the dielectric substrate 4; however, the power feed circuit 3 may be built in the dielectric substrate 4.

The emitting electrode 10 has a feeding point 11 through which radio frequency signals are transferred to and from the power feed circuit 3. The feeding point 11 is electrically connected to the power feed circuit 3 via the filter circuit 20. Specifically, the feeding point 11 is connected to a power feed terminal of the power feed circuit 3 with a via conductor 41a, the filter circuit 20, and a via conductor 41b interposed therebetween. Via conductors 42a to 42c are via conductors for connecting various constitutional elements of the filter circuit 20 to ground, and are connected to a ground terminal of the power feed circuit 3.

The dielectric substrate 4 is provided with a ground electrode 30, which is set to a ground potential and serves as a ground conductor of the emitting electrode 10. When the dielectric substrate 4 is viewed in the stacking direction, for example, the ground electrode 30 is provided to cover substantially the entirety of the dielectric substrate 4 except for the portion where the via conductor 41a is provided. In other words, the ground electrode 30 has an opening (not illustrated) through which the via conductor 41a penetrates. In addition, the filter circuit 20 is formed in the dielectric substrate 4.

In this case, using FIG. 2, a specific example of the filter circuit 20 will be described as Example 1. In the following, an example of the configuration of the antenna device 1 according to the first embodiment illustrated in FIGS. 1A and 1B is also referred to as Example 1.

Figure 2:
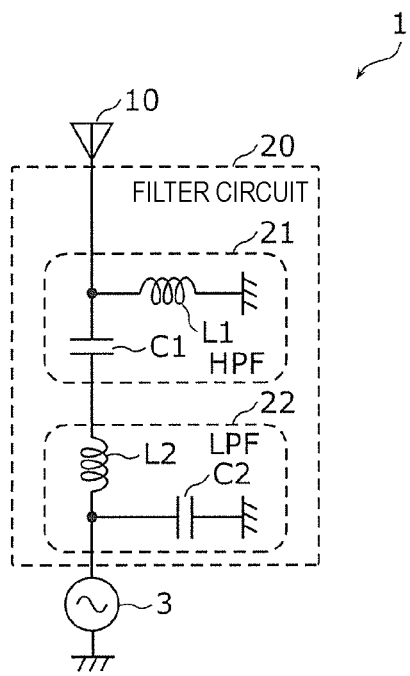
FIG. 2 is a circuit configuration diagram of the antenna device according to Example 1.

FIG. 2 is a circuit configuration diagram of the antenna device 1 according to Example 1.

The filter circuit 20 is a circuit formed on the path connecting the emitting electrode 10 to the power feed circuit 3 as illustrated in FIG. 2. The path is represented by the via conductors 41a and 41b in FIG. 1B. The filter circuit 20 is constituted by two or more circuits that are cascade connected as illustrated in FIG. 2. Each of the two or more circuits is either a high-pass filter circuit (hereinafter also referred to as HPF) 21 or a low-pass filter circuit (hereinafter also referred to as LPF) 22, the HPF 21 having at least one of a capacitive element that is serially connected on the path and an inductor connected between a node on the path and ground, the LPF 22 having at least one of an inductor that is serially connected on the path and a capacitor connected between a node on the path and ground. Although the details will be described later, the antenna device 1 does not have the resonant frequency (hereinafter also referred to as resonant frequency fr) of the emitting electrode 10 and has two or more resonant frequencies different from the resonant frequency fr of the emitting electrode 10, each of which is formed by the emitting electrode 10 and a corresponding one of the two or more circuits.

As illustrated in FIGS. 1B and 2, the two or more circuits in Example 1 include both the HPF 21 and the LPF 22. The HPF 21 has both the capacitive element (in this case, a capacitor C1) that is serially connected on the path and an inductor L1 connected between a node on the path and ground (for example, the ground terminal of the power feed circuit 3). The connecting point where the inductor L1 is connected to the capacitor C1 is connected to the emitting electrode 10. In addition, the LPF 22 has both an inductor L2 that is serially connected on the path and a capacitor C2 connected between a node on the path and ground (for example, the ground terminal of the power feed circuit 3). The connecting point where the inductor L2 is connected to the capacitor C2 is connected to the power feed circuit 3. In addition, the HPF 21 is connected closer to the emitting electrode 10 than the LPF 22 is. Although the details will be described later, the two or more resonant frequencies include a resonant frequency that is formed by the emitting electrode 10 and the HPF 21 and is lower than the resonant frequency fr (hereinafter also referred to as resonant frequency fr1) and a resonant frequency that is formed by the emitting electrode 10 and the LPF 22 and is higher than the resonant frequency fr (hereinafter also referred to as resonant frequency fr2).

For example, the capacitive elements (for example, the capacitors C1 and C2) and elements such as the inductors L1 and L2, which constitute the filter circuit 20, are formed by a conductor pattern in the dielectric substrate 4 as illustrated in FIG. 1B. Note that these elements constituting the filter circuit 20 are not limited to the conductor pattern and may be, for example, chip components such as a chip capacitor and a chip inductor provided between the emitting electrode 10 and the ground electrode 30.

[2. Characteristics]

Next, characteristics of the antenna device 1, the filter circuit 20, the HPF 21, and the LPF 22 will be described using FIGS. 3 to 6.

Figure 3:
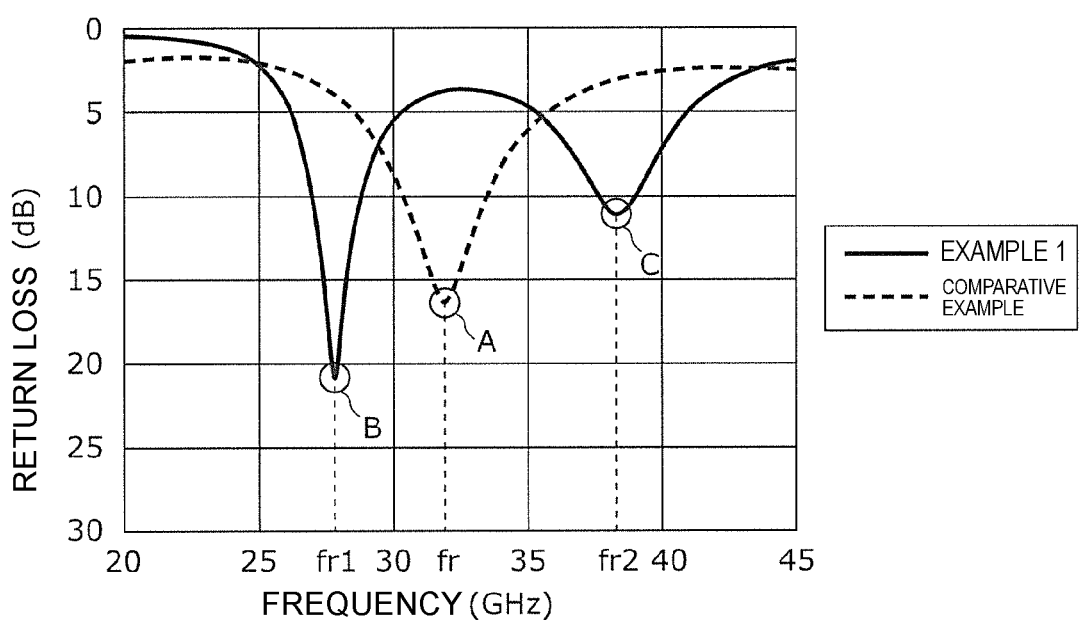
FIG. 3 is a graph illustrating reflection characteristics of the antenna device in Example 1 and an antenna device in a comparative example.

FIG. 3 is a graph illustrating reflection characteristics of the antenna device in Example 1 and an antenna device 1 in a comparative example. A solid line in FIG. 3 indicates reflection characteristics of the antenna device 1 in Example 1, and a broken line in FIG. 3 indicates reflection characteristics of the antenna device in the comparative example. Although not illustrated, the antenna device in the comparative example does not have the filter circuit 20, and the emitting electrode 10 is directly connected to the power feed circuit 3.

In the comparative example, since the antenna device does not have the filter circuit 20, as indicated by the broken line in FIG. 3, the reflection characteristics of the emitting electrode 10 are represented as the reflection characteristics of the antenna device. As in an A portion in FIG. 3, the emitting electrode 10 has one resonant frequency fr of a fundamental.

In Example 1, as indicated by the solid line in FIG. 3, the antenna device 1 has two resonant frequencies. Specifically, the antenna device 1 has a resonant frequency fr1 which is lower than the resonant frequency fr as in a B portion in FIG. 3 and a resonant frequency fr2 which is higher than the resonant frequency fr as in a C portion in FIG. 3.

The HPF 21 and the LPF 22 have a filtering function and also have a function for changing the resonant frequency of the antenna device 1 to a frequency different from the resonant frequency fr of the emitting electrode 10 by being connected to the emitting electrode 10. For example, the HPF 21 forms the resonant frequency fr1, which is lower than the resonant frequency fr, together with the emitting electrode 10, and the LPF 22 forms the resonant frequency fr2, which is higher than the resonant frequency fr, together with the emitting electrode 10. As a result, in Example 1, the antenna device 1 cannot achieve matching at the resonant frequency fr but achieves matching at the resonant frequencies fr1 and fr2 instead.

Figure 4:
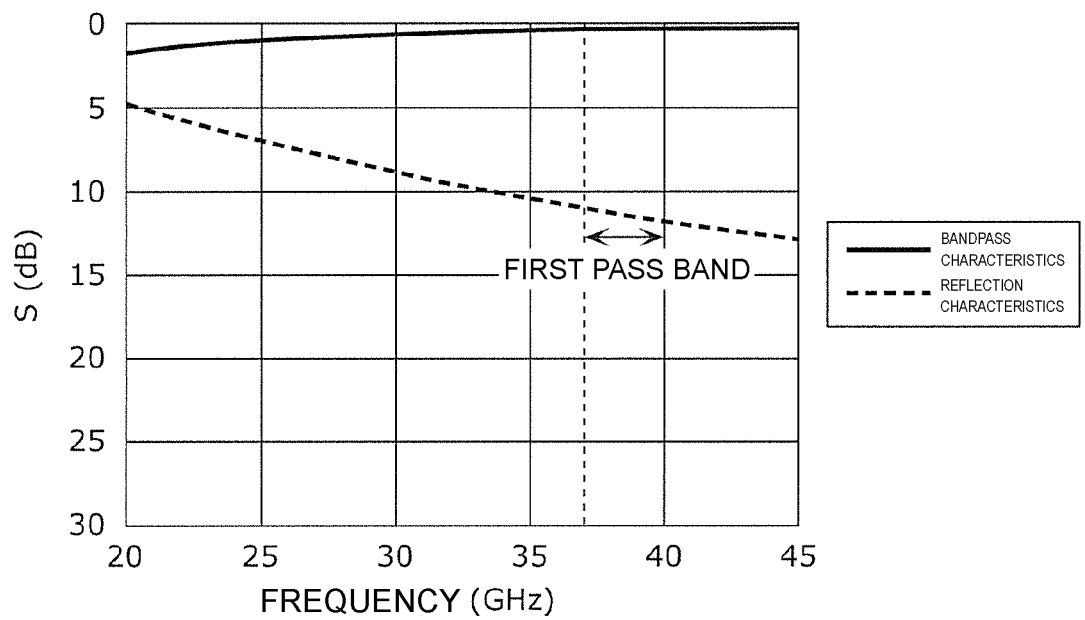
FIG. 4 is a graph illustrating bandpass characteristics and reflection characteristics of a high-pass filter circuit in Example 1.

FIG. 4 is a graph illustrating bandpass characteristics and reflection characteristics of the HPF 21 in Example 1. A solid line in FIG. 4 indicates the bandpass characteristics, and a broken line in FIG. 4 indicates the reflection characteristics. The vertical axis illustrated in FIG. 4 represents insertion loss for the bandpass characteristics and return loss for the reflection characteristics. The same applies to FIGS. 5, 6, and 9 to be described later. As illustrated in FIG. 4, the HPF 21 forms a first pass band on the high frequency side of the resonant frequency fr. In the first pass band, it is clear that the insertion loss is low (that is, signals are more likely to pass therethrough) and the return loss is high (that is, signals are less likely to reflect).

Figure 5:
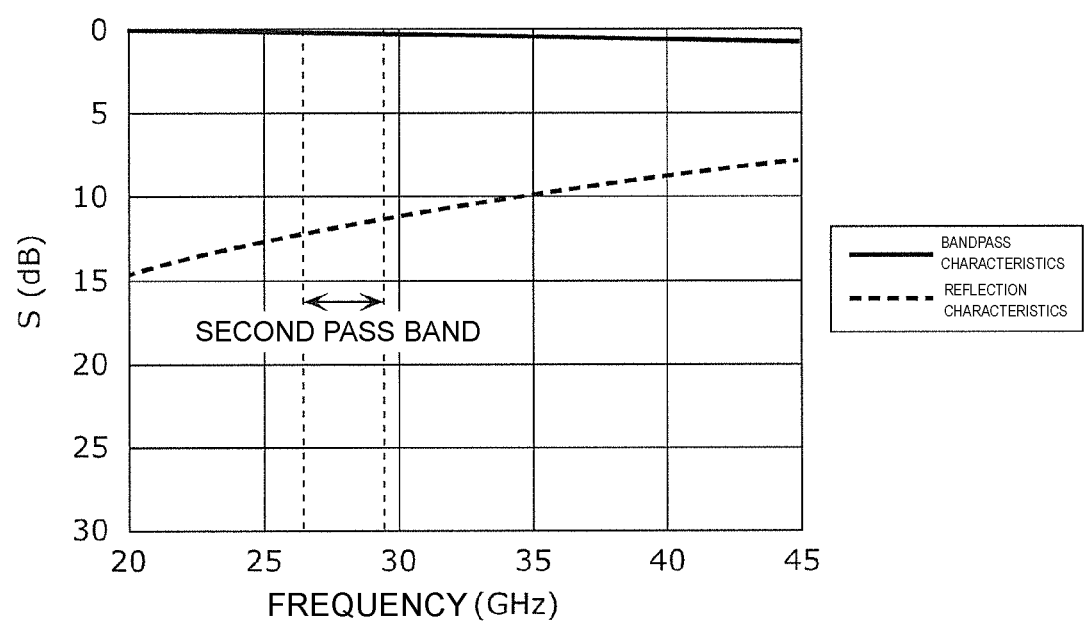
FIG. 5 is a graph illustrating bandpass characteristics and reflection characteristics of a low-pass filter circuit in Example 1.

FIG. 5 is a graph illustrating bandpass characteristics and reflection characteristics of the LPF 22 in Example 1. A solid line in FIG. 5 indicates the bandpass characteristics, and a broken line in FIG. 5 indicates the reflection characteristics. As illustrated in FIG. 5, the LPF 22 forms a second pass band on the low frequency side of the resonant frequency fr. In the second pass band, it is clear that the insertion loss is low and the return loss is high.

Figure 6:
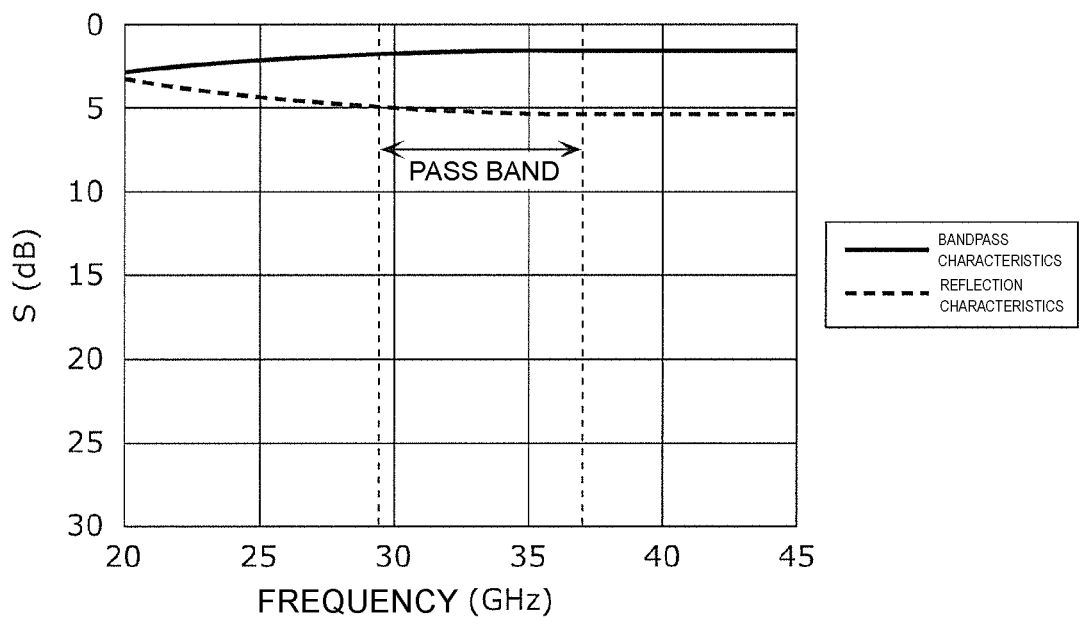
FIG. 6 is a graph illustrating bandpass characteristics and reflection characteristics of a filter circuit in Example 1.

FIG. 6 is a graph illustrating bandpass characteristics and reflection characteristics of the filter circuit 20 in Example 1. A solid line in FIG. 6 indicates the bandpass characteristics, and a broken line in FIG. 6 indicates the reflection characteristics. The filter circuit 20 is constituted by the HPF 21, which forms the first pass band, and the LPF 22, which forms the second pass band, and thus forms a pass band between the first pass band and the second pass band as illustrated in FIG. 6.

For example, there are a problem in that for example harmonics of radio frequency signals used by the antenna device 1 are output from the emitting electrode 10 and a problem in that disturbing waves received by the emitting electrode 10 are input to a low noise amplifier (LNA) and the LNA saturates. To deal with these, unwanted waves such as harmonics and disturbing waves outside these pass bands can be attenuated by using the first pass band, the second pass band, and the pass band between the first pass band and the second pass band.

In this manner, the filter circuit 20 has the filtering function and also has a function for causing the antenna device 1 to achieve matching at the resonant frequencies fr1 and fr2 different from the resonant frequency fr.

[3. Example 2]

Next, an antenna device 1a according to Example 2 will be described using FIGS. 7 to 9.

Figure 7:
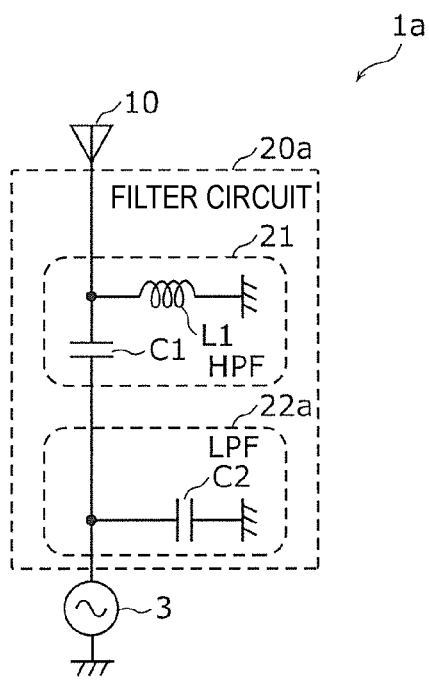
FIG. 7 is a circuit configuration diagram of an antenna device according to Example 2.

FIG. 7 is a circuit configuration diagram of the antenna device 1a according to Example 2. The antenna device 1a according to Example 2 differs from the antenna device 1 according to Example 1 in that the antenna device 1a includes a filter circuit 20a instead of the filter circuit 20. The filter circuit 20a according to Example 2 includes an LPF 22a instead of the LPF 22. The LPF 22a has only the capacitor C2 among the inductor L2 and the capacitor C2. The other points are the same as those of the antenna device 1 according to Example 1, and thus the description thereof will be omitted.

Figure 8:
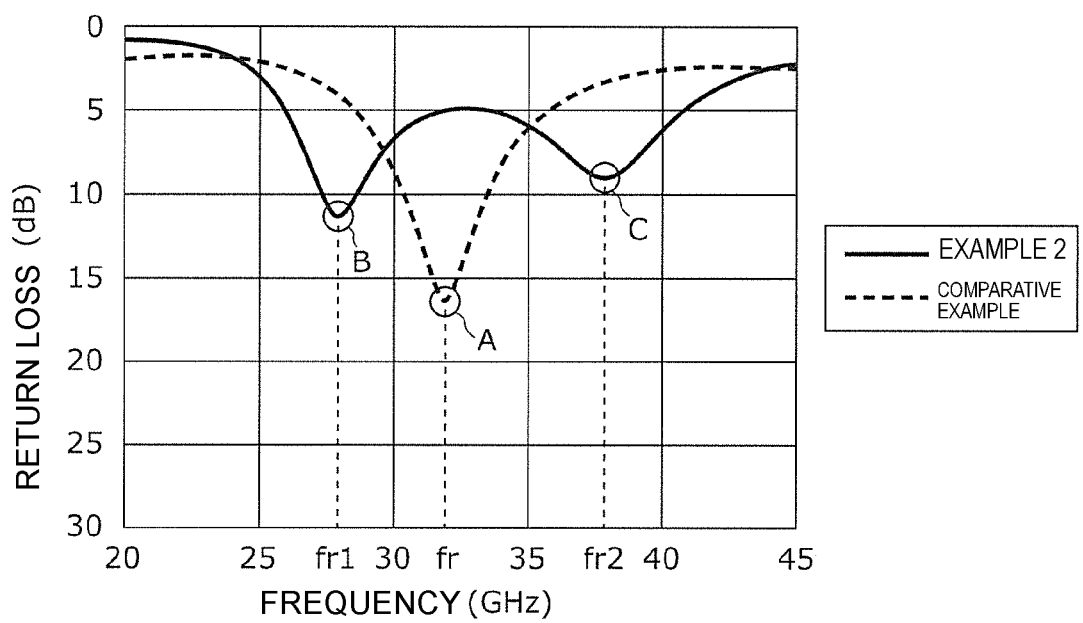
FIG. 8 is a graph illustrating reflection characteristics of the antenna device in Example 2 and the antenna device in the comparative example.

FIG. 8 is a graph illustrating reflection characteristics of the antenna device in Example 2 and the antenna device in the comparative example. A solid line in FIG. 8 indicates reflection characteristics of the antenna device 1a in Example 2, and a broken line in FIG. 8 indicates the reflection characteristics of the antenna device in the comparative example.

As indicated by the solid line in FIG. 8, the antenna device 1a in Example 2 has two resonant frequencies. Specifically, the antenna device 1a has a resonant frequency fr1 which is lower than the resonant frequency fr as in a B portion in FIG. 8 and a resonant frequency fr2 which is higher than the resonant frequency fr as in a C portion in FIG. 8. In this manner, even in a case where the antenna device 1a has the LPF 22a, which has only the capacitor C2, instead of the LPF 22, similarly to as in Example 1, matching is achieved by the HPF 21 and the LPF 22a at the resonant frequencies fr1 and fr2.

Figure 9:
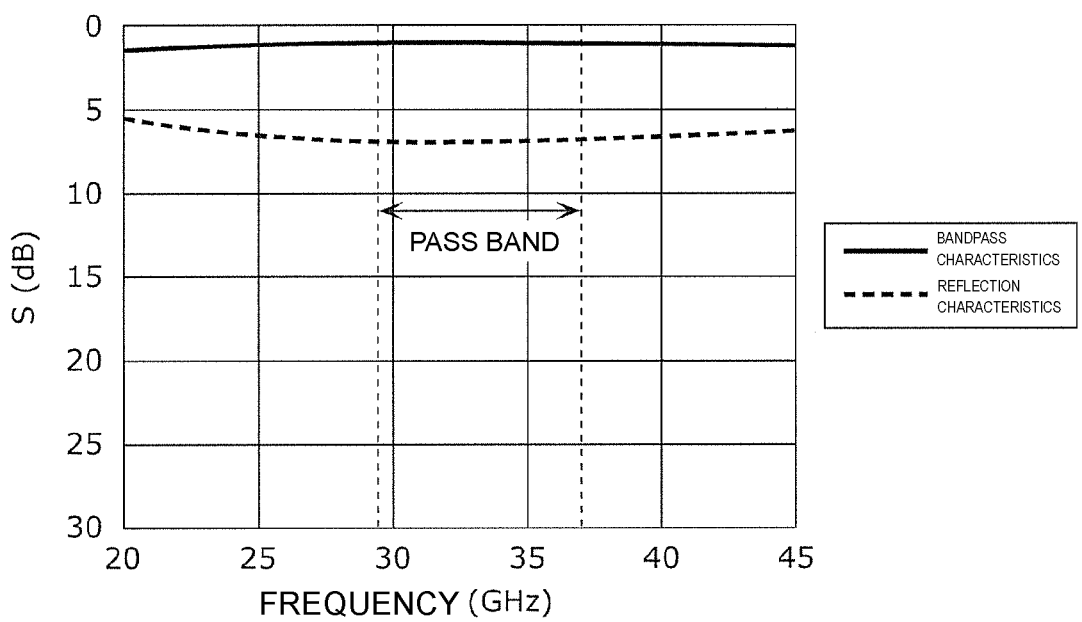
FIG. 9 is a graph illustrating bandpass characteristics and reflection characteristics of a filter circuit in Example 2.

FIG. 9 is a graph illustrating bandpass characteristics and reflection characteristics of the filter circuit 20a in Example 2. A solid line in FIG. 9 indicates the bandpass characteristics, and a broken line in FIG. 9 indicates the reflection characteristics. The filter circuit 20a forms a pass band, similarly to as in Example 1, between the first pass band formed by the HPF 21 and a second pass band (not illustrated) formed by the LPF 22a.

In this manner, the circuit configuration of an LPF included in a filter circuit is not particularly limited. For example, like the LPF 22, the LPF may include both the inductor L2 and the capacitor C2. In addition, like the LPF 22a, the LPF may include only the capacitor C2 and does not have to include the inductor L2.

[4. Example 3]

Next, an antenna device 1b according to Example 3 will be described using FIGS. 10 and 11.

Figure 10:
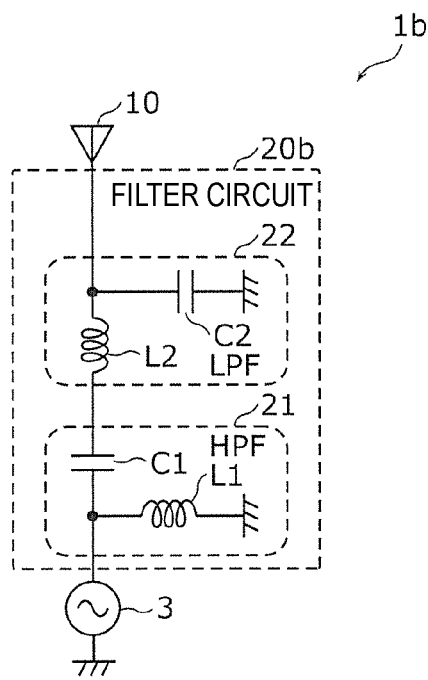
FIG. 10 is a circuit configuration diagram of an antenna device according to Example 3.

FIG. 10 is a circuit configuration diagram of the antenna device 1b according to Example 3. The antenna device 1b according to Example 3 differs from the antenna device 1 according to Example 1 in that the antenna device 1b includes a filter circuit 20b instead of the filter circuit 20. The filter circuit 20b according to Example 3 differs from the filter circuit 20 according to Example 1 in that the LPF 22 is connected closer to the emitting electrode 10 than the HPF 21 is. The other points are the same as those of the antenna device 1 according to Example 1, and thus the description thereof will be omitted.

Figure 11:
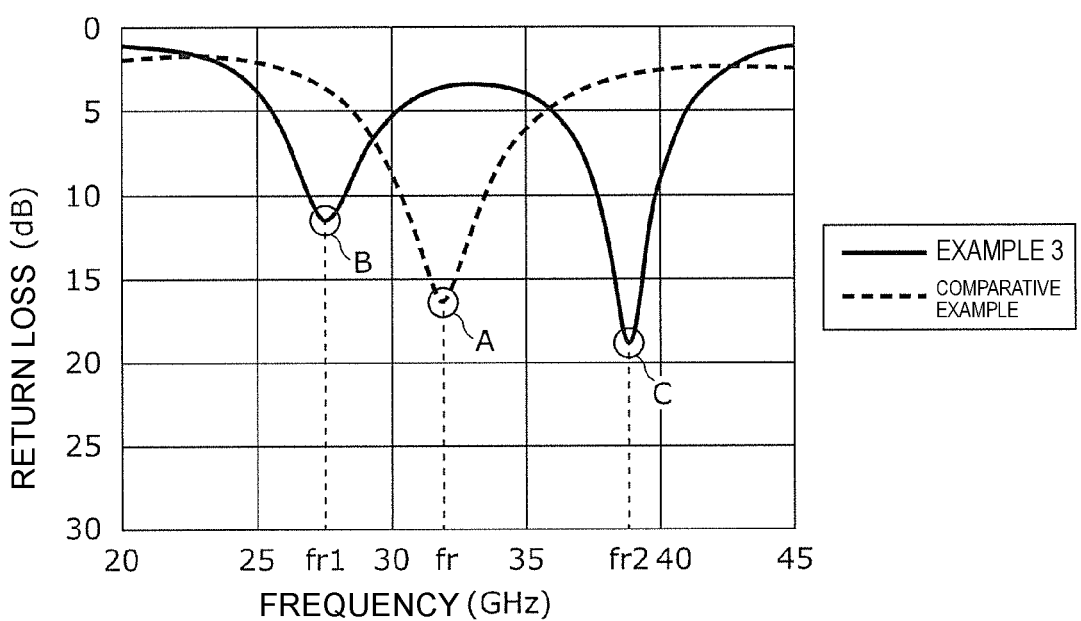
FIG. 11 is a graph illustrating reflection characteristics of the antenna device in Example 3 and the antenna device in the comparative example.

FIG. 11 is a graph illustrating reflection characteristics of the antenna device in Example 3 and the antenna device in the comparative example. A solid line in FIG. 11 indicates reflection characteristics of the antenna device 1b in Example 3, and a broken line in FIG. 11 indicates reflection characteristics of the antenna device in the comparative example.

As indicated by the solid line in FIG. 11, the antenna device 1b has two resonant frequencies in Example 3. Specifically, the antenna device 1b has a resonant frequency fr1 which is lower than the resonant frequency fr as in a B portion in FIG. 11 and a resonant frequency fr2 which is higher than the resonant frequency fr as in a C portion in FIG. 11. In this manner, even in a case where the LPF 22 is connected closer to the emitting electrode 10 than the HPF 21 is, similarly to as in Example 1, matching is achieved by the HPF 21 and the LPF 22 at the resonant frequencies fr1 and fr2.

Note that, as in Example 1, in a case where the HPF 21 is connected closer to the emitting electrode 10 than the LPF 22 is, the following advantages are obtained.

Table 1 below illustrates parameters of individual elements when the antenna device in Example 1 has substantially equivalent characteristics to the antenna device in Example 3. The substantially equivalent characteristics mean that the bandwidth where the return loss near the resonant frequency fr1 is greater than or equal to a certain value (for example, 9.54 dB or higher) and the bandwidth where the return loss near the resonant frequency fr2 is greater than or equal to the certain value in Example 1 are substantially equivalent to those in Example 3.

TABLE 1

|  | L1 (nH) | C1 (pF) | L2 (nH) | C2 (pF) |
|---|---|---|---|---|
| Example 1 | 0.6 | 0.1 | 0.04 | 0.08 |
| Example 3 | 0.6 | 0.2 | 0.4 | 0.06 |

As illustrated in Table 1, in Example 1, the inductance of the inductor L2 included in the LPF 22 is as small as one tenth of the inductance of the inductor L2 in Example 3. That is, in Example 1, in which the HPF 21 is connected closer to the emitting electrode 10 than the LPF 22 is, even when the inductance of the inductor L2 is made smaller, substantially equivalent characteristics to those of Example 3 can be obtained. In general, the smaller the inductance of an inductor, the smaller the component size and the higher the Q value. Thus, by connecting the HPF 21 closer to the emitting electrode 10 than the LPF 22 is, the antenna device 1 can be decreased in size and the Q value of the inductor L2 can be increased.

In addition, in a case where the emitting electrode 10 is constituted by a power feed conductor and a non-power feed conductor arranged above the power feed conductor, when the HPF 21 is connected closer to the emitting electrode 10 than the LPF 22 is, the capacitor C1 included in the HPF 21 may be omitted. This is because the power feed conductor and the non-power feed conductor have capacitive components and these can be used, instead of the capacitor C1, as capacitive elements that are serially connected on the path connecting the emitting electrode 10 to the power feed circuit 3. Thus, the antenna device 1 can be decreased in size by an amount corresponding to the space that would have been taken up by the capacitor C1.

In contrast, as in Example 3, in a case where the LPF 22 is connected closer to the emitting electrode 10 than the HPF 21 is, the following advantages are obtained.

In general, the effect caused by phase rotation and by a change in impedance becomes stronger as the frequency increases. The LPF 22 is a circuit that forms a resonant frequency higher than the resonant frequency of the emitting electrode 10, and thus is more likely to be affected by the effect than the HPF 21. Thus, in a case where the HPF 21 is connected closer to the emitting electrode than the LPF 22 is, the LPF 22 is greatly affected by the effect caused by phase rotation and by a change in impedance due to the HPF 21 and it becomes difficult to achieve impedance matching. Thus, in a case where the LPF 22 is connected closer to the emitting electrode than the HPF 21 is, it becomes easy to achieve impedance matching.

[5. Summary]

As described above, matching is achieved at two or more resonant frequencies different from the resonant frequency fr of the emitting electrode 10. In this case, radio frequency signals at the two or more resonant frequencies each uses a fundamental, and thus the directivities match. Thus, while suppressing a reduction in antenna efficiency, dual-band support can be achieved.

Specifically, matching is achieved by the HPF 21 on the low frequency side of the resonant frequency fr of the emitting electrode 10 and matching is achieved by the LPF 22 (22a) on the high frequency side of the resonant frequency fr of the emitting electrode 10. Thus, dual-band support can be achieved by using the resonant frequency fr1, which is lower than the resonant frequency fr of the emitting electrode 10, and the resonant frequency fr2, which is higher than the resonant frequency fr.

For example, a dual-band antenna device with 28 GHz as the lower frequency band and 39 GHz as the higher frequency band is needed for the fifth generation mobile communication system (5G), and according to the present disclosure, an antenna device can be provided that can achieve dual-band support while suppressing a reduction in antenna efficiency.

Second Embodiment

Next, an antenna device 1c according to a second embodiment will be described using FIGS. 12A and 12B.

FIG. 12A is an external perspective view of the antenna device 1c according to the second embodiment. FIG. 12B is a side perspective view of the antenna device 1c according to the second embodiment. FIG. 12B is the side perspective view of the antenna device 1c when the antenna device 1c is seen from the plus side in the X-axis direction. In FIGS. 12A and 12B, similarly to as in FIGS. 1A and 1B, the dielectric material is transparent, which makes the inside of the dielectric substrate 4 visible.

As illustrated in FIG. 12A, in the antenna device 1c according to the second embodiment, the emitting electrode 10 has a first feeding point 11a and a second feeding point 11b. In addition, the antenna device 1c according to the second embodiment has filter circuits 20 corresponding to the respective first and second feeding points 11a and 11b. The other points are the same as those of the antenna device 1 according to the first embodiment (Example 1), and thus the description thereof will be omitted.

As illustrated in FIGS. 12A and 12B, the first feeding point 11a and the second feeding point 11b are connected to the power feed circuit 3 via the respective different filter circuits 20. The first feeding point 11a and the second feeding point 11b are provided at different positions in or on the emitting electrode 10. The direction of a polarized wave formed by the first feeding point 11a differs from the direction of a polarized wave formed by the second feeding point 11b. For example, the first feeding point 11a forms a wave polarized in the Y-axis direction and the second feeding point 11b forms a wave polarized in the X-axis direction. As a result, one emitting electrode 10 can handle two polarized waves. That is, even in a case where a plurality of polarized waves are used, the emitting electrode 10 does not have to be provided for each polarized wave, and thus the antenna device 1c can be decreased in size.

Third Embodiment

Next, an antenna device 1d according to a third embodiment will be described using FIG. 13.

Figure 13:
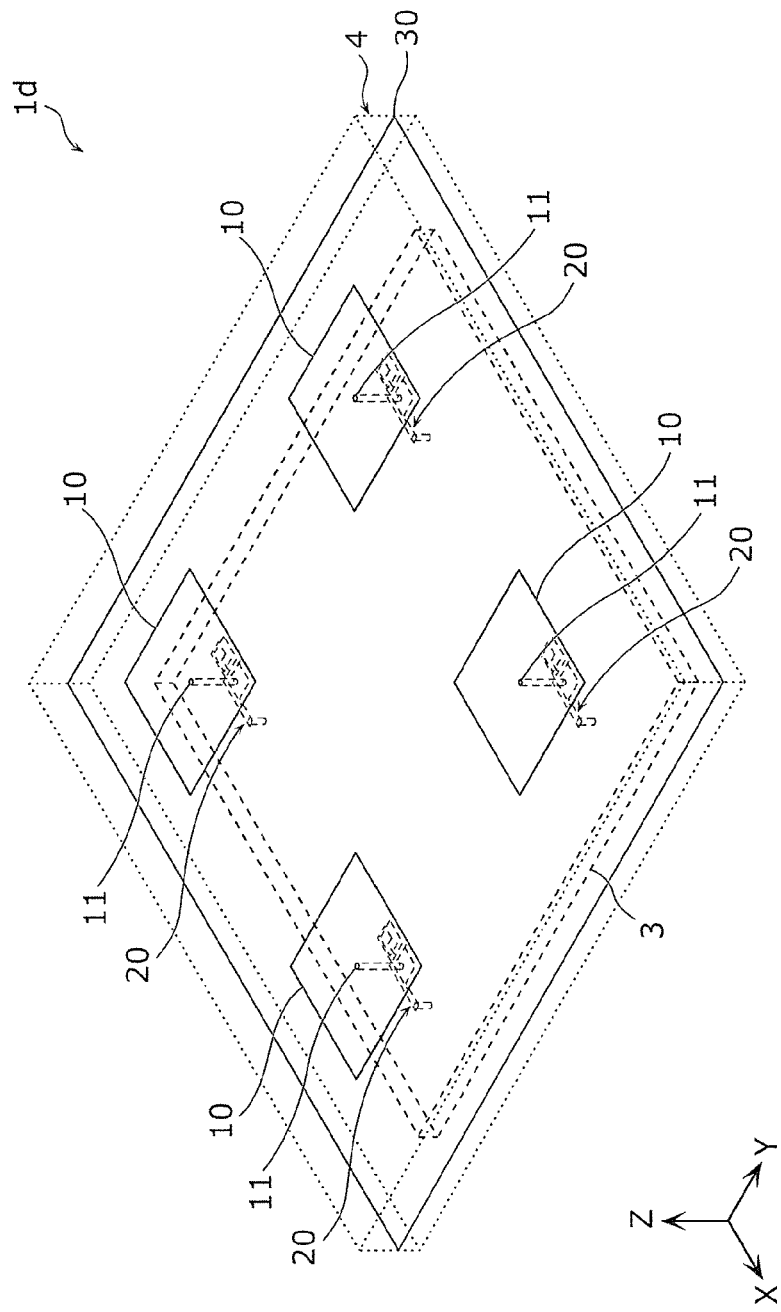
FIG. 13 is an external perspective view of an antenna device according to a third embodiment.

FIG. 13 is an external perspective view of the antenna device 1d according to the third embodiment. In FIG. 13, similarly to as in FIG. 1A, the dielectric material is transparent, which makes the inside of the dielectric substrate 4 visible.

As illustrated in FIG. 13, the antenna device 1d according to the third embodiment includes a plurality of emitting electrodes 10, and the plurality of emitting electrodes 10 are arranged in a matrix on the dielectric substrate 4. That is, the plurality of emitting electrodes 10 are an array antenna. In addition, the antenna device 1d according to the third embodiment includes filter circuits 20 corresponding to the plurality of respective emitting electrodes 10. Note that FIG. 13 illustrates a portion of the dielectric substrate 4, and the antenna device 1d actually includes many emitting electrodes 10 other than the four emitting electrodes 10 and can be applied to a massive multiple-input and multiple-output (MIMO) system. The other points are the same as those of the antenna device 1 according to the first embodiment (Example 1), and thus the description thereof will be omitted.

Fourth Embodiment

The antenna devices described above can be applied to communication devices. In the following, a communication device 5, to which the antenna device 1d according to the third embodiment is applied, will be described.

Figure 14:
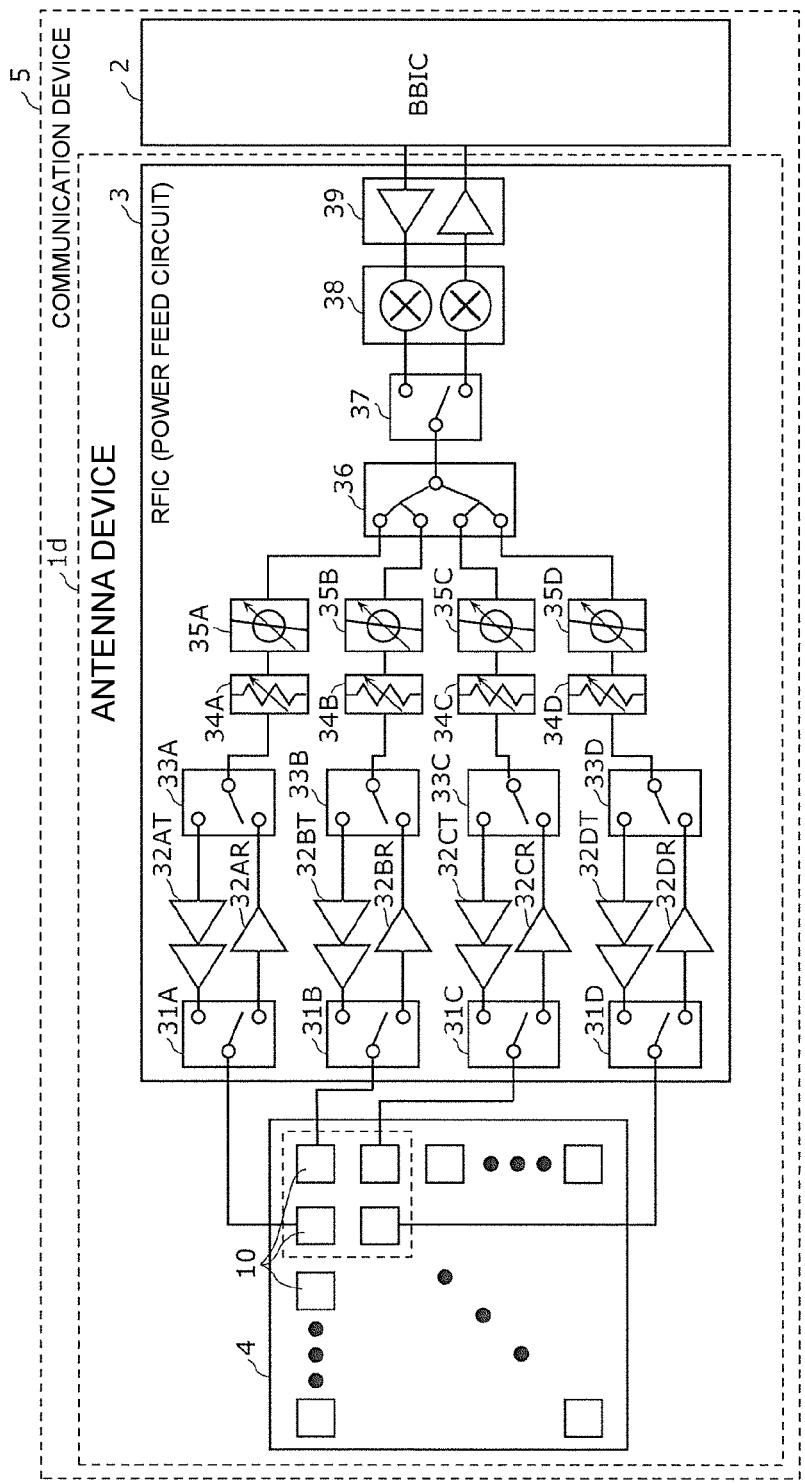
FIG. 14 is a configuration diagram illustrating an example of a communication device according to a fourth embodiment.

FIG. 14 is a configuration diagram illustrating an example of the communication device 5 according to a fourth embodiment. In FIG. 14, for brevity, only the configuration corresponding to the four emitting electrodes 10 among the plurality of emitting electrodes 10 of the antenna device 1d is illustrated, and the configuration corresponding to the other emitting electrodes 10 configured substantially the same is omitted.

The communication device 5 includes the antenna device 1d and a baseband signal processing circuit (BBIC) 2. The communication device 5 up-converts a signal transferred from the baseband signal processing circuit (BBIC) 2 to the antenna device 1d into a radio frequency signal, emits the radio frequency signal from the emitting electrodes 10, and also down-converts a radio frequency signal received by the emitting electrodes 10 and performs signal processing on the resulting signal at the baseband signal processing circuit (BBIC) 2.

The RFIC (power feed circuit) 3 includes switches 31A to 31D, 33A to 33D, and 37, power amplifiers 32AT to 32DT, low-noise amplifiers 32AR to 32DR, attenuators 34A to 34D, phase shifters 35A to 35D, a signal multiplexer/demultiplexer 36, a mixer 38, and an amplifier circuit 39.

The switches 31A to 31D and 33A to 33D are switch circuits for switching between transmission and reception for the respective signal paths.

The signal transferred from the baseband signal processing circuit (BBIC) 2 is amplified by the amplifier circuit 39 and up-converted by the mixer 38. The up-converted radio frequency signal is split into four signals by the signal multiplexer/demultiplexer 36, and the four signals pass through four transmission paths and are fed to the respective different emitting electrodes 10. In this case, by individually adjusting the degrees of phase shift of the phase shifters 35A to 35D arranged on the respective signal paths, it becomes possible to adjust the directivities of the plurality of emitting electrodes 10 (array antenna).

In addition, the radio frequency signals received by the respective emitting electrodes 10 travel via four respective different reception paths and are multiplexed by the signal multiplexer/demultiplexer 36, and the resulting signal is down-converted by the mixer 38, is amplified by the amplifier circuit 39, and is transferred to the baseband signal processing circuit (BBIC) 2.

The RFIC (power feed circuit) 3 is formed as, for example, a one-chip integrated circuit component including the circuit configuration described above.

Note that the RFIC (power feed circuit) 3 does not have to include any of the switches 31A to 31D, 33A to 33D, and 37, the power amplifiers 32AT to 32DT, the low-noise amplifiers 32AR to 32DR, the attenuators 34A to 34D, the phase shifters 35A to 35D, the signal multiplexer/demultiplexer 36, the mixer 38, and the amplifier circuit 39 described above. In addition, the RFIC (power feed circuit) 3 may have only either the transmission paths or the reception paths. In addition, the communication device 5 according to the present embodiment can be applied also to a system that not only transmits and receives radio frequency signals of a single frequency band (band) but also transmits and receives radio frequency signals of a plurality of frequency bands (multiple bands).

Note that the antenna device 1d is applied to the communication device 5 configured as above; however, the antenna device 1, 1a, 1b, or 1c may also be applied. As a result, a communication device can be provided that can achieve dual-band support while suppressing a reduction in antenna efficiency.

Other Embodiments

The antenna devices and communication device according to the embodiments of the present disclosure have been described above by taking the embodiments described above as examples; however, the present disclosure is not limited to the embodiments described above. The present disclosure also includes other embodiments realized by combining arbitrary structural elements in the embodiments described above and modifications obtained by adding, to the embodiments described above, various changes that those skilled in the art conceive without necessarily departing from the gist of the present disclosure.

For example, the filter circuits include both the HPF and the LPF in the embodiments described above but do not have to include both. For example, a filter circuit may include two or more HPFs that are cascade connected and achieve matching at two or more resonant frequencies lower than the resonant frequency fr of the emitting electrode 10. In addition, for example, a filter circuit may include two or more LPFs that are cascade connected and achieve matching at two or more resonant frequencies higher than the resonant frequency fr of the emitting electrode 10.

In addition, for example, matching is achieved at the two resonant frequencies fr1 and fr2, which are different from the resonant frequency fr, in the embodiments described above; however, matching may be achieved at three or more resonant frequencies. In this case, the filter circuit includes three or more circuits that are cascade connected.

In addition, for example, the emitting electrode 10 is a patch antenna in the embodiments described above; however, the emitting electrode 10 may be a monopole antenna (including a dipole antenna), a notch antenna, or the like.

In addition, for example, the filter circuits are provided in the dielectric substrate 4 in the embodiments described above; however, the filter circuits may be provided on the first main surface or the second main surface of the dielectric substrate 4.

In addition, for example, the dielectric substrate 4 is a multilayer board in the embodiments described above; however, the dielectric substrate 4 does not have to be a multilayer board.

In addition, for example, in the HPF 21 in the embodiments described above, the inductor L1 and the capacitor C1 are connected in this order when seen from the side where the emitting electrode 10 is provided; however, the capacitor C1 and the inductor L1 may be connected in this order. In addition, in the LPF 22, the inductor L2 and the capacitor C2 are connected in this order when seen from the side where the emitting electrode 10 is provided; however, the capacitor C2 and the inductor L2 may be connected in this order. Note that, in a case where a shunt inductor or a shunt capacitor is directly connected to the emitting electrode 10, the design accuracy can be increased. This is because, in a case where a series inductor or a series capacitor is directly connected to the emitting electrode 10, the design accuracy is decreased due to the series component.

In addition, the inductors included in the filter circuit may include a wiring inductor formed by a wire connecting individual structural elements to each other.

In addition, for example, the antenna devices according to the embodiments described above can also be applied to a massive MIMO system. One of promising wireless transmission technologies for 5G is a combination of a Phantom cell and a massive MIMO system. The Phantom cell is a network configuration that isolates a control signal for ensuring communication stability between a macro cell of a low frequency band and small cells of a high frequency band from a data signal that is a target of high speed data communication. A massive MIMO antenna device is provided in individual Phantom cells. The massive MIMO system is a technology for improving transmission quality in a millimeter wave band or the like, and controls the antenna directivity by controlling a signal transmitted from each emitting electrode 10. In addition, since the massive MIMO system uses many emitting electrodes 10, a beam with sharp directivity can be generated. By increasing the beam directivity, radio waves can be sent a long distance to some extent, even in a high frequency band, and the interference between cells is also reduced to increase the frequency utilization efficiency.

INDUSTRIAL APPLICABILITY

The present disclosure can be widely used, in communication devices such as a massive MIMO system, as an antenna device and a communication device that can achieve dual-band support while suppressing a reduction in antenna efficiency.

REFERENCE SIGNS LIST 1, 1a, 1b, 1c, 1d antenna device
2 baseband signal processing circuit (BBIC)
3 power feed circuit (RFIC)
4 dielectric substrate
5 communication device
10 emitting electrode
11 feeding point
11a first feeding point
11b second feeding point
20, 20a, 20b filter circuit
21 high-pass filter circuit (HPF)
22, 22a low-pass filter circuit (LPF)
30 ground electrode
31A, 31B, 31C, 31D, 33A, 33B, 33C, 33D, 37 switch
32AR, 32BR, 32CR, 32DR low-noise amplifier
32AT, 32BT, 32CT, 32DT power amplifier
34A, 34B, 34C, 34D attenuator
35A, 35B, 35C, 35D phase shifter
36 signal multiplexer/demultiplexer
38 mixer
39 amplifier circuit
41a, 41b, 42a, 42b, 42c via conductor
C1 capacitor (capacitive element)
C2 capacitor
L1, L2 inductor

The invention claimed is:

1. An antenna device comprising:
a dielectric substrate;
an emitting electrode in or on the dielectric substrate;
a power feed circuit in or on the dielectric substrate, the power feed circuit being configured to feed power to the emitting electrode; and
a filter circuit in a path connecting the emitting electrode to the power feed circuit, wherein:
the filter circuit comprises two or more circuits that are cascade connected,
each of the two or more circuits is a high-pass filter circuit or a low-pass filter circuit, the high-pass filter circuit comprising a capacitive element serially connected in the path or an inductor connected between ground and a first node on the path, the low-pass filter circuit comprising an inductor serially connected in the path or a capacitor connected between ground and a second node on the path,
the antenna device does not have a resonant frequency of the emitting electrode, and the antenna device has two or more resonant frequencies, the two or more resonant frequencies being different than the resonant frequency of the emitting electrode, each of the two or more resonant frequencies being formed by the emitting electrode and a corresponding one of the two or more circuits.

2. The antenna device according to claim 1, wherein:
the two or more circuits comprise the high-pass filter circuit and the low-pass filter circuit, and
the two or more resonant frequencies comprise:
a first resonant frequency formed by the emitting electrode and the high-pass filter circuit, the first resonant frequency being less than the resonant frequency of the emitting electrode, and a second resonant frequency formed by the emitting electrode and the low-pass filter circuit, the second resonant frequency being greater than the resonant frequency of the emitting electrode.

3. The antenna device according to claim 1, wherein:
the high-pass filter circuit forms a first pass band having frequencies greater than the resonant frequency of the emitting electrode,
the low-pass filter circuit forms a second pass band having frequencies less than the resonant frequency of the emitting electrode, and
the filter circuit forms a pass band between the first pass band and the second pass band.

4. The antenna device according to claim 1, wherein:
the two or more circuits comprise the high-pass filter circuit and the low-pass filter circuit, and
the high-pass filter circuit is connected between the emitting electrode and the low-pass filter circuit.

5. The antenna device according to claim 1, wherein:
the two or more circuits comprise the high-pass filter circuit and the low-pass filter circuit, and
the low-pass filter circuit is connected between the emitting electrode and the high-pass filter circuit.

6. The antenna device according to claim 1, wherein:
the high-pass filter circuit comprises the capacitive element serially connected in the path and the inductor connected between ground and the first node, and
the low-pass filter circuit comprises the capacitor connected between ground and the second node, and does not comprise the inductor serially connected in the path.

7. The antenna device according to claim 1, wherein:
the high-pass filter circuit comprises the capacitive element serially connected in the path and the inductor connected between ground and the first node, and
the low-pass filter circuit comprises the inductor serially connected in the path and the capacitor connected between ground and the second node.

8. The antenna device according to claim 1, wherein:
the emitting electrode has a first feeding point and a second feeding point, the first feeding point and the second feeding point being at different positions in or on the emitting electrode, and
a direction of a polarized wave formed by a signal supplied to the emitting electrode at the first feeding point and a direction of a polarized wave formed by a signal supplied to the emitting electrode at the second feeding point are different.

9. The antenna device according to claim 1, comprising:
a plurality of emitting electrodes, the emitting electrode being one of the plurality of emitting electrodes,
wherein the plurality of emitting electrodes are arranged in a matrix in or on the dielectric substrate.

10. The antenna device according to claim 1, wherein the filter circuit is in the dielectric substrate.

11. An antenna device comprising:
a dielectric substrate;
an emitting electrode in or on the dielectric substrate;
a power feed circuit in or on the dielectric substrate, the power feed circuit being configured to feed power to the emitting electrode; and
a filter circuit in a path connecting the emitting electrode to the power feed circuit, wherein:
the filter circuit comprises two or more circuits that are cascade connected,
each of the two or more circuits is a high-pass filter circuit or a low-pass filter circuit, the high-pass filter circuit comprising a capacitive element serially connected in the path or an inductor connected between ground and a first node on the path, the low-pass filter circuit comprising an inductor serially connected on the path or a capacitor connected between ground and a second node on the path, the two or more circuits comprise the high-pass filter circuit and the low-pass filter circuit, and the high-pass filter circuit is connected between the emitting electrode and the low-pass filter circuit.

12. A communication device comprising:

the antenna device according to claim 1; and a baseband integrated circuit (BBIC), wherein the power feed circuit is a radio frequency integrated circuit (RFIC) configured to perform:

transmission-system signal processing for up-converting a signal input from the BBIC and for outputting the up-converted signal to the emitting electrode, and receiving-system signal processing for down-converting a radio frequency signal input from the emitting electrode and outputting the down-converted signal to the BBIC.

* * * * *